US010843916B2

(12) United States Patent
Meinhold et al.

(10) Patent No.: US 10,843,916 B2
(45) Date of Patent: Nov. 24, 2020

(54) MECHANICAL STRESS DECOUPLING FOR MICROELECTROMECHANICAL SYSTEMS (MEMS) ELEMENTS WITH GEL-FILLING

(71) Applicant: Infineon Technologies AG, Neubiberg (DE)

(72) Inventors: Dirk Meinhold, Chemnitz (DE); Florian Brandl, Maxhütte-Haidhof (DE); Robert Gruenberger, Nandlstadt (DE); Wolfram Langheinrich, Dresden (DE); Sebastian Luber, Oberschleißheim (DE); Roland Meier, Regensburg (DE); Bernhard Winkler, Regensburg (DE)

(73) Assignee: Infineon Technologies AG

( * ) Notice: Subject to any disclaimer, the term of this patent is extended or adjusted under 35 U.S.C. 154(b) by 0 days.

(21) Appl. No.: 16/291,412

(22) Filed: Mar. 4, 2019

(65) Prior Publication Data

US 2020/0283286 A1 Sep. 10, 2020

(51) Int. Cl.
| | |
|---|---|
| *G01L 19/14* | (2006.01) |
| *B81B 3/00* | (2006.01) |
| *B81B 7/00* | (2006.01) |
| *G01L 9/06* | (2006.01) |

(52) U.S. Cl.
CPC .......... *B81B 3/0072* (2013.01); *B81B 3/0021* (2013.01); *B81B 7/0048* (2013.01); *B81B 2201/0264* (2013.01)

(58) Field of Classification Search
CPC ..... G01L 9/0054; G01L 15/00; G01L 19/141; G01L 19/148; H01L 29/84; H01L 2924/181; H01L 2924/1461; H01L 2924/1815; H01L 2224/48465; H01L 2224/48091; B81B 7/0058; B81B 2207/015; B81B 2207/012; B81B 2201/0264; B81B 2201/025; B81C 2203/0154

See application file for complete search history.

(56) References Cited

U.S. PATENT DOCUMENTS

| | | | | |
|---|---|---|---|---|
| 2007/0068779 | A1* | 3/2007 | Baldo ............... | G01L 5/223 200/16 R |
| 2008/0224242 | A1* | 9/2008 | Villa ............... | B81C 1/00158 257/419 |
| 2012/0012949 | A1* | 1/2012 | Winkler ............... | G01L 9/0054 257/415 |

(Continued)

*Primary Examiner* — Brian Turner
(74) *Attorney, Agent, or Firm* — Design IP (57) ABSTRACT

A semiconductor device and a method of manufacturing the same are provided. The semiconductor device includes a semiconductor chip including a substrate having a first surface and a second surface arranged opposite to the first surface; at least one stress-decoupling trench that extends from the first surface into the substrate, where the at least one stress-decoupling trench extends partially into the substrate towards the second surface although not completely to the second surface; a microelectromechanical systems (MEMS) element, including a sensitive area, disposed at the first surface of the substrate and laterally spaced from the at least one stress-decoupling trench; and a stress-decoupling material that fills the at least one stress-decoupling trench and covers the sensitive area of the MEMS element.

19 Claims, 5 Drawing Sheets (56) References Cited

U.S. PATENT DOCUMENTS

| | | | |
|---|---|---|---|
| 2013/0205908 A1* | 8/2013 | Hsu | G01L 9/0047 |
| | | | 73/725 |
| 2016/0282212 A1* | 9/2016 | Beer | G01L 19/147 |
| 2017/0016790 A1 | 1/2017 | Van Der Wiel | |
| 2018/0017456 A1* | 1/2018 | Kautzsch | G01L 9/0042 |
| 2019/0242772 A1* | 8/2019 | Duqi | G01L 19/0084 |

* cited by examiner

MECHANICAL STRESS DECOUPLING FOR MICROELECTROMECHANICAL SYSTEMS (MEMS) ELEMENTS WITH GEL-FILLING

FIELD

The present disclosure relates generally to semiconductor devices and a method of manufacturing the same, and, more particularly, microelectromechanical systems (MEMS) elements with a stress relief mechanism.

BACKGROUND

Microelectromechanical systems (MEMS) are microscopic devices, particularly those with moving parts. MEMS became practical once they could be fabricated using modified semiconductor device fabrication technologies, normally used to make electronics. Thus, a MEMS may be built into a substrate as a component of an integrated circuit, that is diced into a semiconductor chip that is subsequently mounted in a package.

Mechanical stress and other external mechanical influences introduced to a package may inadvertently be transferred through the package to an integrated MEMS element, such as sensor, and, more particularly, to a pressure sensor. This transferred mechanical stress may affect the operation of the MEMS element or induce a shift (e.g., an offset) in a sensor signal that may lead to incorrect measurements.

For example, semiconductor pressure sensors have a pressure sensitive element arranged to measure an absolute pressure or a relative pressure (e.g. the difference between two pressures). A problem with many pressure sensors is that the sensor measures (or outputs, or gives) a signal, even in the absence of a pressure (or pressure difference) to be measured. This offset may be the result of mechanical stress and/or deformation of the housing (e.g., the packaging) of the sensor. The housing-stress/deformation will typically also cause a stress-component at the sensor surface where the sensitive elements (e.g., piezo-resistors) are located, and thereby cause an offset error, a linearity error, or even a hysteresis error to the output signal.

Therefore, an improved device capable of decoupling mechanical stress from an integrated MEMS element may be desirable.

SUMMARY

Embodiments provide semiconductor devices and a method of manufacturing the same, and, more particularly, microelectromechanical systems (MEMS) elements with a stress relief mechanism.

Embodiments provide a semiconductor device that includes a semiconductor chip including a substrate having a first surface and a second surface arranged opposite to the first surface; at least one stress-decoupling trench that extends from the first surface into the substrate, where the at least one stress-decoupling trench extends partially into the substrate towards the second surface although not completely to the second surface; a microelectromechanical systems (MEMS) element, including a sensitive area, disposed at the first surface of the substrate and laterally spaced from the at least one stress-decoupling trench; and a stress-decoupling material that fills the at least one stress-decoupling trench and covers the sensitive area of the MEMS element.

BRIEF DESCRIPTION OF THE DRAWINGS

Embodiments are described herein making reference to the appended drawings.

DETAILED DESCRIPTION

In the following, various embodiments will be described in detail referring to the attached drawings, where like reference numerals refer to like elements throughout. It should be noted that these embodiments serve illustrative purposes only and are not to be construed as limiting. For example, while embodiments may be described as comprising a plurality of features or elements, this is not to be construed as indicating that all these features or elements are needed for implementing embodiments. Instead, in other embodiments, some of the features or elements may be omitted, or may be replaced by alternative features or elements. Additionally, further features or elements in addition to the ones explicitly shown and described may be provided, for example conventional components of sensor devices.

Features from different embodiments may be combined to form further embodiments, unless specifically noted otherwise. Variations or modifications described with respect to one of the embodiments may also be applicable to other embodiments. In some instances, well-known structures and devices are shown in block diagram form rather than in detail in order to avoid obscuring the embodiments.

Connections or couplings between elements shown in the drawings or described herein may be wire-based connections or wireless connections unless noted otherwise. Furthermore, such connections or couplings may be direct connections or couplings without additional intervening elements or indirect connections or couplings with one or more additional intervening elements, as long as the general purpose of the connection or coupling, for example to transmit a certain kind of signal or to transmit a certain kind of information, is essentially maintained.

Embodiments relate to microelectromechanical systems (MEMS), and particularly to a capacitive MEMS, and more particularly to MEMS pressure sensors, integrated in a semiconductor chip and subsequently mounted to a package. The MEMS may be referred to as a MEMS element or MEMS device. The package is adapted to enable the MEMS pressure sensor to detect and/or measure a force imposed thereon. For example, the MEMS pressure sensor may operate as a transducer that generates an electrical signal as a function of the pressure imposed, and the package may have an opening formed in proximity to the MEMS pressure sensor that allows a medium to interact with the MEMS pressure sensor. The medium may be any pressure measurable or pressure inducing entity.

In general, a sensor, as used herein, may refer to a component which converts a physical quantity to be measured to an electric signal, for example a current signal or a voltage signal. The physical quantity may, for example, be pressure as an expression of force imposed on a sensitive area or region of the sensor. Debris, such as foreign particles, may negatively impact the performance of any sensor. Thus, it is desirable to prevent debris from reaching the surface of the sensor, and, specifically, from reaching the sensitive area or region of the sensor.

A manufacturing process for semiconductor chip fabrication may include two sequential sub-processes commonly referred to as front-end and back-end production. The back-end production may further include two sequential sub-processes commonly referred to as pre-assembly and assembly.

Front-end production refers primarily to wafer fabrication. A wafer, as used herein, may also be referred to as a substrate. The front-end production may start with a clean disc-shaped silicon wafer that will ultimately become many silicon chips. First, a photomask that defines the circuit patterns for circuit elements (e.g., transistors) and interconnect layers may be created. This mask may then be laid on the clean silicon wafer and is used to map the circuit design. Transistors and other circuit elements may then be formed on the wafer through photolithography. Photolithography involves a series of steps in which a photosensitive material is deposited on the wafer and exposed to light through a patterned mask; unwanted exposed material is then etched away, leaving only the desired circuit pattern on the wafer. By stacking the various patterns, individual elements of the semiconductor chip may be defined. A MEMS device or MEMS element may also be incorporated onto and/or into the surface of the wafer and connected to one or more circuit elements. During the final phase of the front-end production process, each individual chip on the wafer is electrically tested to identify properly functioning chips for assembly.

Back-end production refers to the assembly and test of individual semiconductor devices or chips. The assembly process is intended to protect the chip, facilitate its integration into electronic systems, limit electrical interference and enable the dissipation of heat from the device. Once the front-end production process is complete, the wafer is sawed or diced into individual semiconductor chips. This dicing of the wafer into individual semiconductor chips is referred to as pre-assembly.

In an assembly phase of the back-end production, the semiconductor chips are incorporated into a package. For example, these semiconductor chips may be individually attached by means of an alloy or an adhesive to a lead frame, a metallic device used to connect the semiconductor to a circuit board. Leads on the lead frame may then be connected by aluminum or gold wires to the input/output terminals on the semiconductor chip through the use of automated machines known as wire bonders. Each semiconductor device may then be at least partially encapsulated in a plastic molding compound or a ceramic case, forming the package.

Thus, a MEMS element may be built into a substrate as a component of an integrated circuit, the substrate then being diced into semiconductor chips that are each subsequently mounted in a package.

It will be appreciated that while the pre-assembly (i.e., dicing) process may be described as part of the back-end production flow, the chips may be partially singulated during final phase of the front-end production. Thus, in some instances, pre-assembly may begin or may be performed during the front-end production.

According to one or more embodiments, mechanical stress-decoupling is provided to a MEMS element as a stress relief mechanism. A stress-decoupling feature such as one or more trenches (i.e., one or more stress-decoupling trenches) may be provided. In additionally, each stress-decoupling trench is filled with a gel (e.g., a silicone gel) and the gel may additionally be deposited on the MEMS element at the wafer level (i.e., during the front-end production process), or during or subsequent to the pre-assembly process, but prior to assembly (i.e., packaging). The protective material may be deposited on an exposed surface of the MEMS element such that an entire exposed surface of the MEMS element is covered by the protective material.

The exposed surface of the MEMS element may include or may be referred to as a sensitive area that enables the MEMS element to measure a physical quantity. For example, the MEMS element may be a MEMS pressure sensor that is configured to detect or measure a change in pressure in response to a change of force imposed on the exposed surface. The protective material is configured such that, when the MEMS element is covered by the protective material, a sensor functionality of the MEMS element remains intact. For example, the protective material may be a silicone gel that has an elastic modulus and/or a Poisson's ratio that permits a force exerted thereon to be transferred to the MEMS pressure sensor. Thus, the protective material is flexible enough that when the protective material is depressed, the sensitive area of the MEMS pressure sensor is also depressed proportionally.

More particularly, the protective material permits full sensor functionality of the MEMS element, including mechanical functionality and electrical functionality, while sealing an entire surface of the MEMS element. Even more particularly, the protective material is configured such that no functionality of the MEMS element is impeded by the protective material.

By ensuring that the functionality of the MEMS element remains intact, the protective material may be deposited onto the MEMS element as a permanent material at an early stage of the chip fabrication process. Thus, the MEMS element may already be configured in an operable state (e.g., a final operable state) at the time the protective material is deposited onto the MEMS element, and the protective material may remain completely intact after deposition, including throughout the assembly process, such that it remains a feature in the final product.

As a result of the early deposition of the protective material, the MEMS element is provided early particle and humidity protection from foreign matter that may have been introduced during (pre-)assembly processes that could influence the sensor performance.

While some embodiments provided herein may refer to the protective material as being a temperature hardening gel (e.g., silicone gel), others may use a ultraviolet (UV) hardening gel. However, the protective material is not limited thereto, and may be any material that provides protection from foreign matter while permitting sensor functionality of the MEMS element, and more particularly permits sensor functionality of the MEMS element at the time of deposition of the protective material. Thus, the protective material may be any temperature or UV hardening gel.

Figure 1:
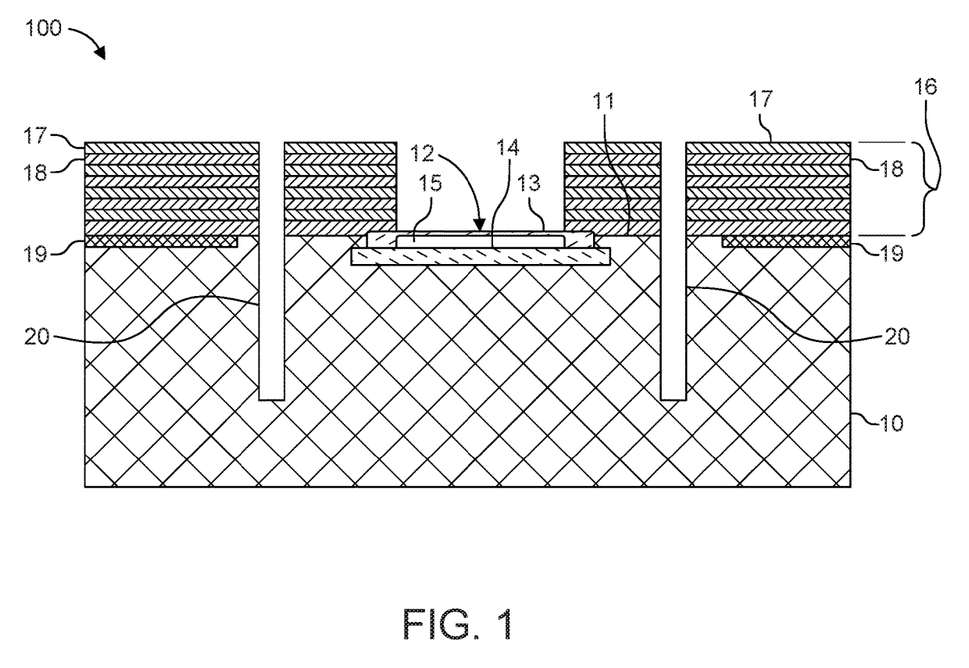
FIG. 1 shows a cross-sectional diagram of a chip according to one or more embodiments.

FIG. 1 shows a cross-sectional diagram of a chip 100 according to one or more embodiments. The chip 100 includes a semiconductor substrate 10 (e.g., a silicon substrate) having a main surface 11 on the frontside of the chip 100 and a capacitive MEMS element 12 provided at the main surface 11. The capacitive MEMS element 12 includes two parallel conductive plates: a top electrode 13 and a bottom electrode 14, separated by a dielectric material 15. For example, the dielectric material 15 may be a vacuum where a cavity is formed between the top electrode 13 and the bottom electrode 14. The vacuum serves as a reference pressure for the pressure sensor. A dielectric layer (not illustrated) may also be disposed between the electrodes 13 and 14 (e.g., on the upper surface of the bottom electrode 14).

The electrodes 13 and 14 form a capacitive element having a baseline or reference capacitance when no pressure is applied to the MEMS element 12. The top electrode 13 is flexible and pressure sensitive, where as the bottom electrode is rigid and fixed being located on the rigid substrate 10 beneath and/or around it. The top electrode 13 may be a sensitive diaphragm or membrane and the cavity is formed between the fixed, bottom electrode 14 plate and the movable electrode 13 to allow deflection of the diaphragm or membrane. When pressure is applied onto the sensitive diaphragm, the cavity enclosed between the two parallel electrodes 13 and 14 reduces in volume as the sensitive diaphragm deflects and approaches the stationary one, resulting in a detectable change in the capacitance between the electrodes 13 and 14 corresponding the to applied pressure. The change in capacitance is a readable value through an electrical signal.

The chip 100 further includes a back end of line (BEOL) stack 16 that includes multiple (alternating) dielectric layers 17 and metal layers 18. The BEOL is the second portion of IC fabrication where the individual devices (transistors, capacitors, resistors, etc.) get interconnected with wiring on the wafer, the metalization layer.

The chip 100 further includes a shallow trench isolation (STI) region 19 which is an integrated circuit feature which prevents electric current leakage between adjacent semiconductor device components.

The chip 100 further includes a stress-decoupling feature made of one or more stress-decoupling trenches 20. Each stress-decoupling trench 20 is laterally spaced from the MEMS element 12, extends from the main surface 11 of the substrate 10 into the substrate 10, and extends partially through the substrate 10. In other words, the trenches 20 do not extend completely through the substrate 10.

The trenches 20 define a vertical boundary between an inner or a first region 21 of the chip 100, where the MEMS element 12 is provided, and one or more peripheral or second regions 22 of the chip 100. The trenches 20 are configured to decouple any mechanical stress coming from, for example, the package of the chip 100 from the MEMS element 12. That is, the trenches 20 are configured to reduce any mechanical stress present in the peripheral region 22 of the chip 100 from being transferred to the inner region 21 of the chip 100, and ultimately to the MEMS element 12. Thus, the stress-decoupling feature shields the MEMS element 12 from external mechanical influences and thereby prevents a shift in a sensor signal produced by the MEMS element 12 due these influences.

Figure 2A:
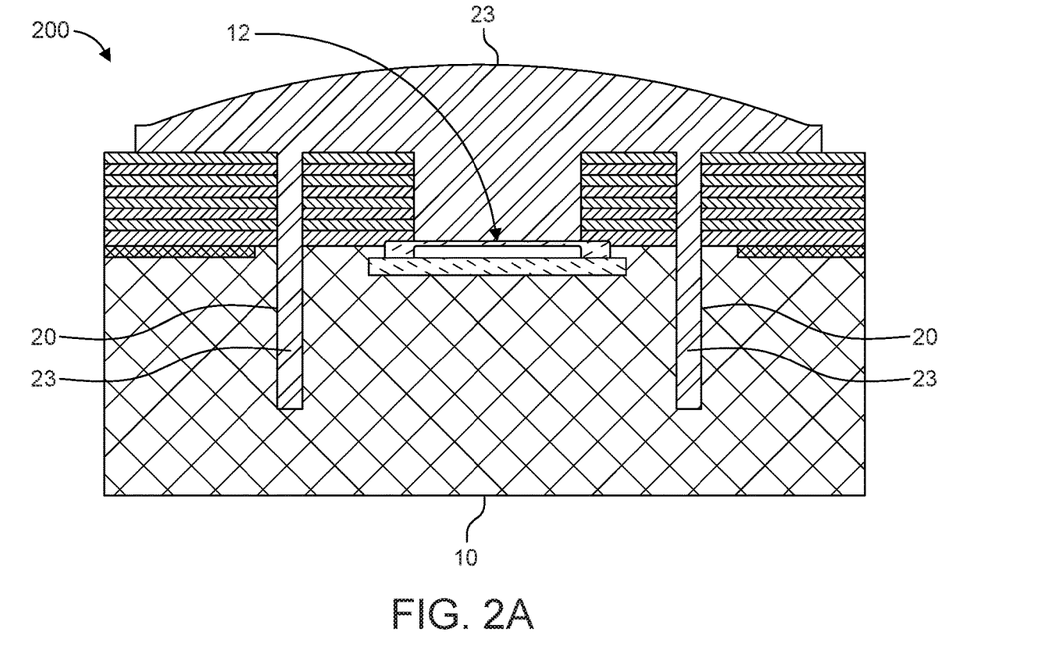
FIGS. 2A and 2B show a cross-sectional diagram of a chip according to one or more embodiments.
Figure 2B:
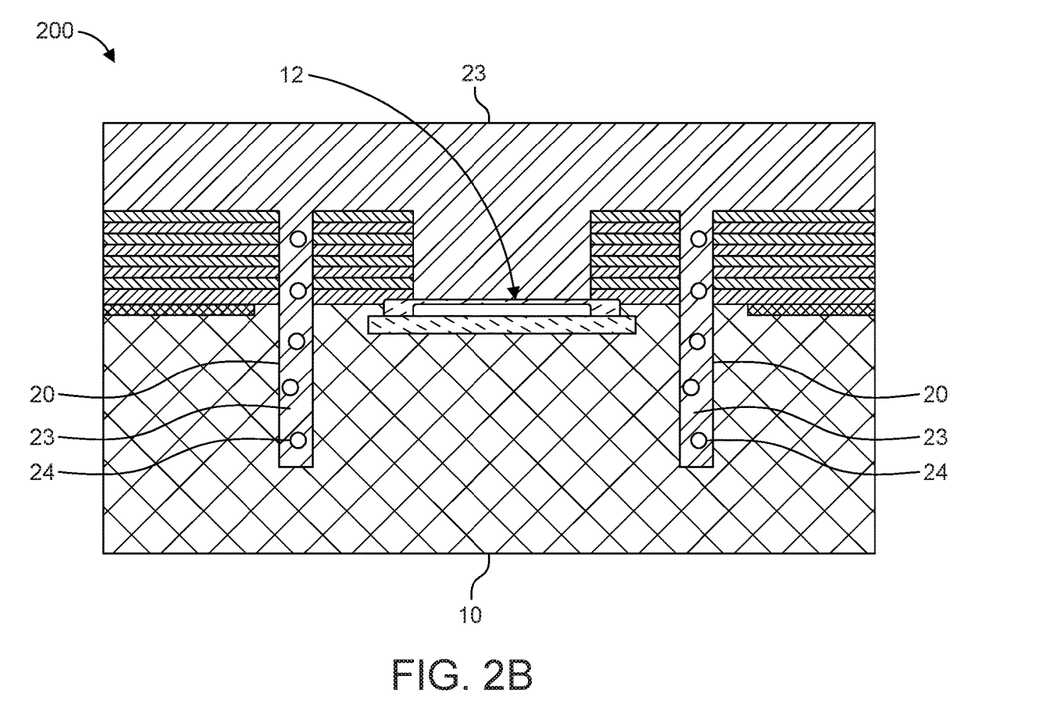

FIGS. 2A and 2B show a cross-sectional diagram of a chip 200 according to one or more embodiments. In particular, chip 200 is similar to chip 100 illustrated in FIG. 1, with the addition of a stress-decoupling material 23 disposed in the trenches 20. Thus, each trench 20 may be completely filled with stress-decoupling material 23. The stress-decoupling material 23 may be a made of a material configured to reduce the transfer of mechanical stress from one or more peripheral regions 22 to the inner region 21 by, for example, absorption. For example, the stress-decoupling material 23 may be a gel made of silicone or a silicone-based material that is ultimately set by curing.

The stress-decoupling material 23 may also be disposed in an area over the MEMS element 12 (i.e., such that an entire exposed surface of the MEMS element 12 is covered by the stress-decoupling material 23) and may serve as a protective material. In other words, the MEMS element 12 is sealed by the stress-decoupling material 23 at its upper surface from an external environment that may protect the MEMS element 12 from particles, debris, chemicals, and humidity that may otherwise contaminate the MEMS element 12. Furthermore, the stress-decoupling material 23 is composed of a material (e.g., temperature hardening gel or UV hardening gel) that permits a sensor functionality of the MEMS element 12. More particularly, stress-decoupling material 23 permits full sensor functionality of the MEMS element, including mechanical functionality and electrical functionality, while sealing an entire (upper) surface of the MEMS element 12. Thus, in the case of the MEMS element 12 being a pressure sensor, the stress-decoupling material 23 permits that external pressure be applied to the stress-decoupling material 23 and transferred to the top electrode 13 in a manner that can be sensed by the pressure sensor 12. For example, the stress-decoupling material 23 may be a material that has an elastic modulus and/or a Poisson's ratio that permits a force exerted thereon to be transferred to the MEMS element 12. Again, the stress-decoupling material 23 may be a silicon or silicone-based gel that serves both functions to decouple mechanical stress and to protect the MEMS element 12 from the external environment.

The stress-decoupling material 23 dispensed in the trenches 20 may be the same material dispensed as the protective material over the MEMS element 12, or the materials used in the trenches 20 and over the MEMS element 12 may be different materials. Thus, the material(s) may be dispensed in a single step or in multiple steps, for example, by inkjet printing or micro dispensing. However, the embodiments are not limited to a particular method for depositing the materials.

As shown in FIG. 2A, the stress-decoupling material 23 may be dispensed only in the trenches 20, in the inner region 21 over the MEMS element 12, and partially in the peripheral regions 22 over the BEOL stack 16. In another example, FIG. 2B shows that the stress-decoupling material 23 may be dispensed over the entire chip 200 and/or package.

In addition, FIG. 2A demonstrates a case in which the stress-decoupling material 23 is provided to densely fill the trenches 20 to completely fill the trenches without any voids. In contrast, FIG. 2B demonstrates a case in which the stress-decoupling material 23 is provided to more loosely fill the trenches 20. In particular, in FIG. 2B, voids 24 are suspended in the stress-decoupling material 23 provided in the trenches 20.

In order to densely fill the trenches 20, a gel material that does not form voids may be used. Alternatively, a de-aeration process may be used to eliminate voids within the gel before curing. Thus, air that may be entrapped during a mixing cycle of the gel is removed. To accomplish this, the mixture may be placed under 70 mm vacuum. Once the full vacuum is applied, the material will froth and expand about four times its original volume, crest, and eventually recede back to its original level. The de-aeration cycle is complete approximately two minutes after the frothing action ceases. Subsequently, the material can be cured. Using this technique, a state can be achieved where the gel is definedly partially removed from the trenches 20 during the de-aering It will be appreciated that the degree to which the trenches 20 are densely or loosely filled may be regulated and that these features are applicable to any one of the embodiments disclosed herein that use gel to fill the trenches. Thus, more loosely filled trenches can be applied to FIG. 2A, whereas more densely filled trenches can be applied to FIG. 2B, and vice versa.

Figure 3A:
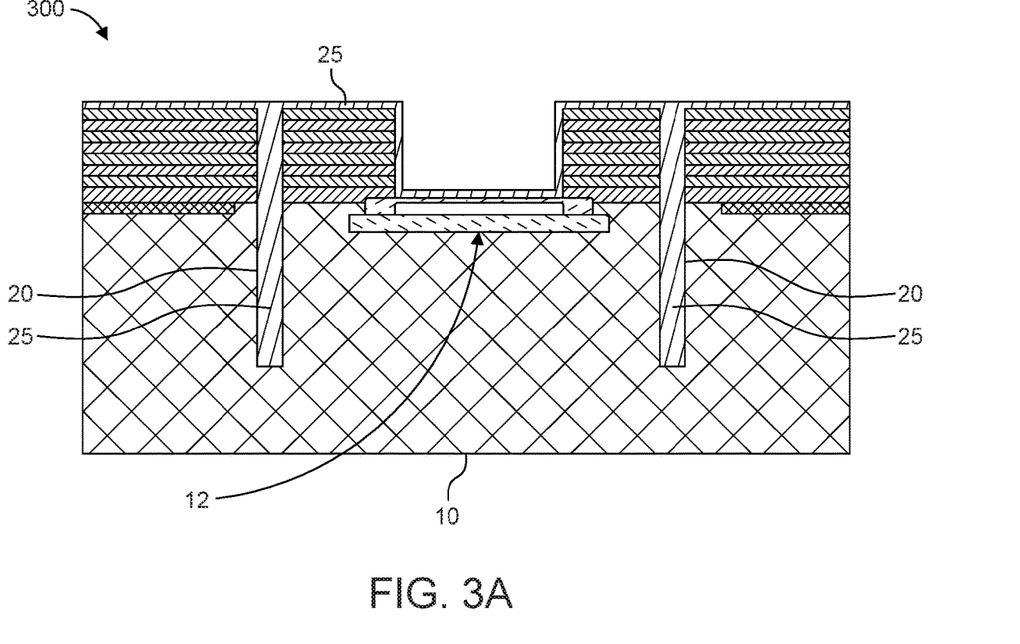
FIGS. 3A and 3B show a cross-sectional diagram of a chip 200 according to one or more embodiments.
Figure 3B:
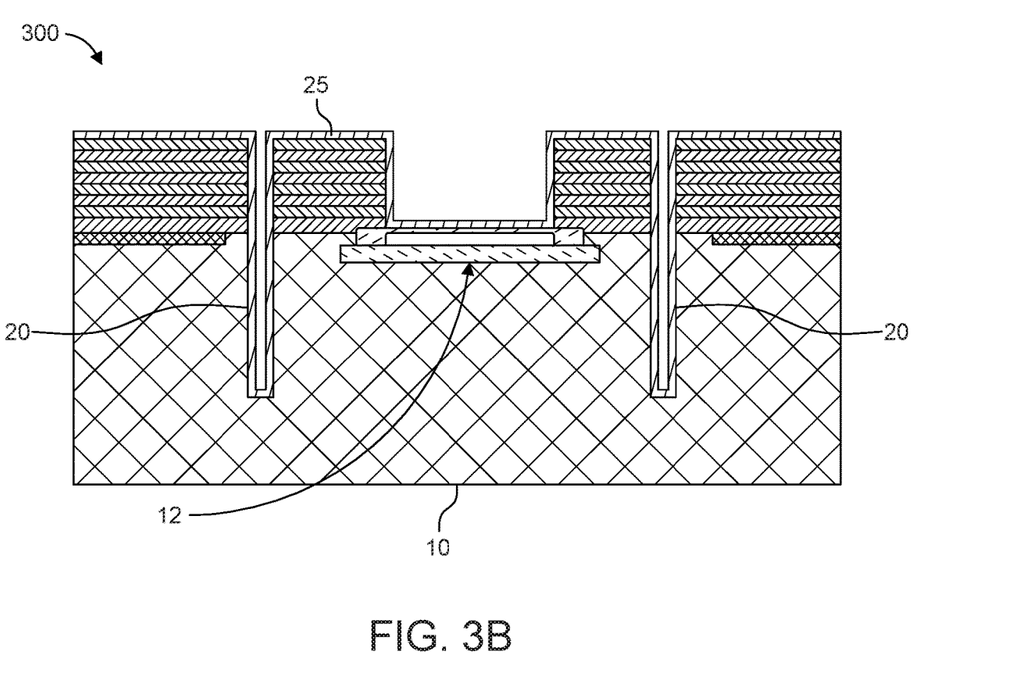

FIGS. 3A and 3B show a cross-sectional diagram of a chip 300 according to one or more embodiments. In particular, chip 200 is similar to chip 100 illustrated in FIG. 1, with the addition of a stress-decoupling material disposed in the trenches 20 as a single conformal protective layer 25. The conformal protective layer 25 is a thin (polymeric) film which conforms to the contours of the trenches 20 and the frontside surface of the chip 300, including the upper surface of the BEOL stack 26 and the upper surface of the top electrode 13. The conformal protective layer 25 may completely fill the trenches 20, as shown in FIG. 3A, such that the trenches 20 are closed, or may partially fill the trenches 20, as shown in FIG. 3B such that a void remains between the sidewalls of the trenches 20. Thus, the conformal protective layer 25 may provide a stress-decoupling function as well as a protective function.

Figure 4:
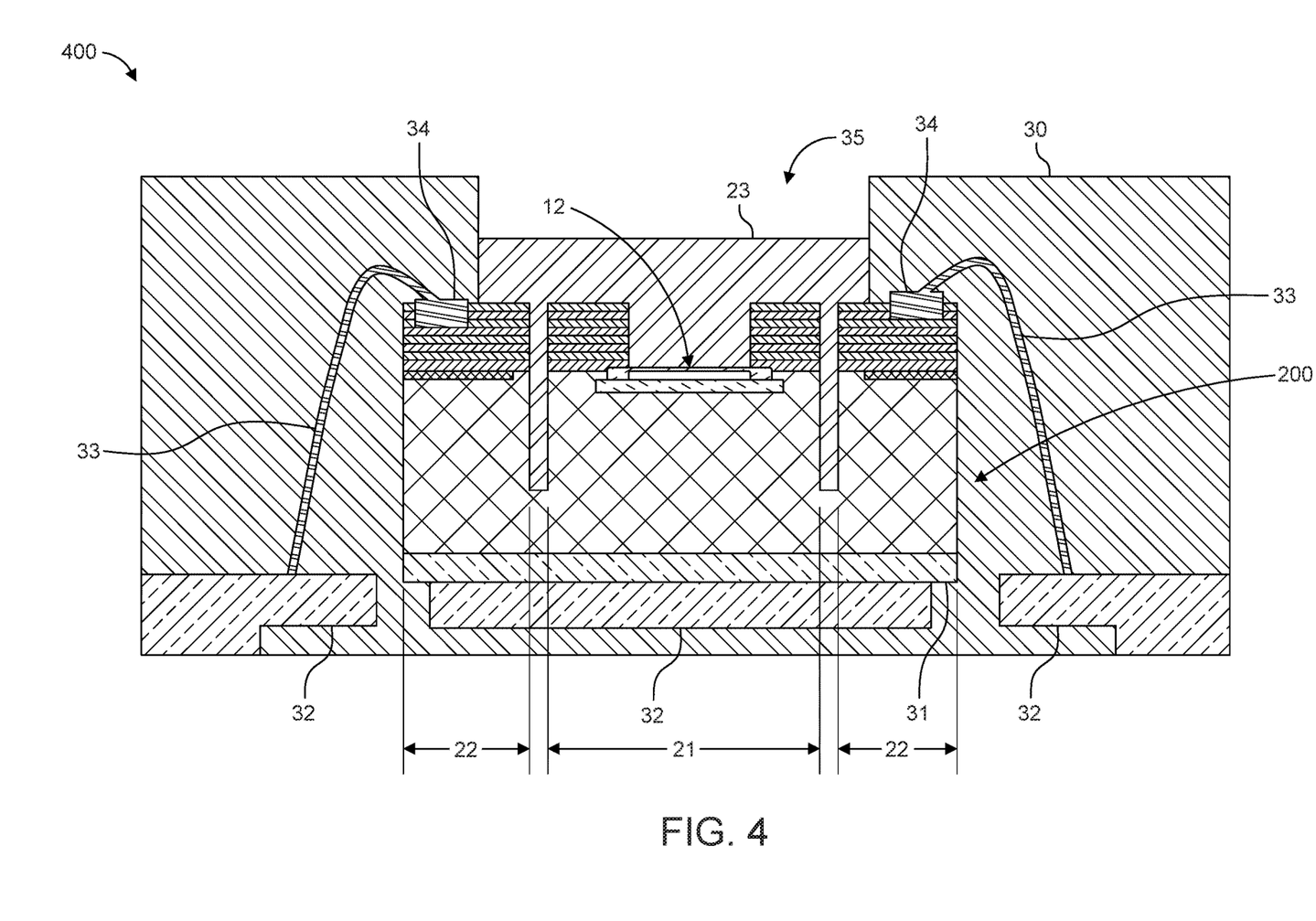
FIG. 4 shows a cross-sectional diagram of a chip package according to one or more embodiments.

FIG. 4 shows a cross-sectional diagram of a chip package 400 according to one or more embodiments. In particular, the chip package 400 is a molded package that houses a chip (e.g., chip 200) in a molded compound 30. The chip package 400 further includes an attach layer 31 that attaches the chip 200 to a lead frame 32. The attach layer 31 may be an adhesive, such as glue, or other attach material. Bond wires 33 are used to attach respective die pads 34 of the chip 200 to the leads of the lead frame 32.

From a process point of view, the chip 200 may be attached to the lead frame 32 by the attach layer 31 and the bond wires 33 may be coupled to the lead frame 32 and the die pads 34. Then, the lead frame 32, the chip 200 and the bond wires 33 may be molded in the molded compound 30. The stress-decoupling material 23 may then be dispensed within the trenches 20 and over the MEMS element 12, at least partially filling the cavity 35 formed by sidewalls of the molded compound. In particular, the cavity 35 is provided over the MEMS element 12 such that an exerted pressure can be applied to the MEMS element 12 through the stress-decoupling material 23. The stress-decoupling material 23 may fully extend laterally between the sidewalls of the molded compound 30. Finally, the stress-decoupling material 23 may be cured.

In the example shown in FIG. 4, the chip 200 is symmetrically or uniformly attached to the lead frame 32. In other words, the chip 200 is substantially centered onto the lead frame 32. In this case, the full chip backside (i.e., the entire back surface) is bonded to the lead frame 32. Here, the peripheral regions 22 and the inner region 21 at the backside of the chip 200 are bonded to the lead frame 32 via the attach layer 31.

Figure 5:
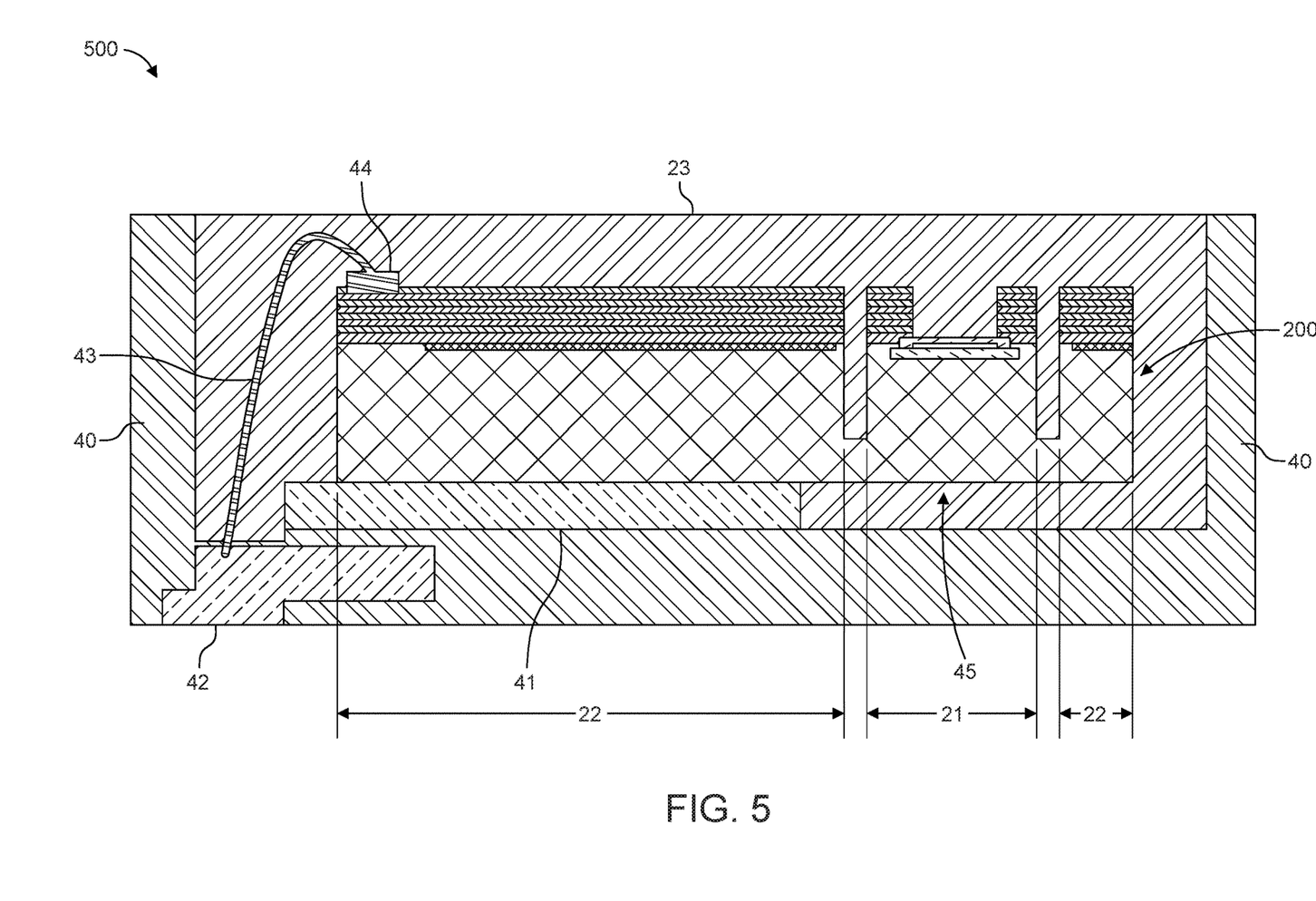
FIG. 5 shows a cross-sectional diagram of a chip package according to one or more embodiments.

FIG. 5 shows a cross-sectional diagram of a chip package 500 according to one or more embodiments. The chip package 500 includes a molded compound 40, an attach layer 41, a lead frame 42, a bond wire 43 that electrically couples the lead frame 42 to a die pad 44 of a chip, a chip (e.g., chip 200), and a stress-decoupling material 23. The molded compound 40 includes sidewalls and a base portion that form a cavity in which the chip 200 is disposed at the bottom of the cavity.

In this case, the chip 200 is asymmetrically attached within the chip package 500 to the base portion of the molded compound 40 via the attach layer 41. In other words, the backside of the chip 200 is only bonded to the molded compound 40 via the attach layer 41 at a peripheral region 22. Thus, only a portion of the chip backside is bonded to the lead frame 32, where the bonded portion of the backside is offset from the center of the chip. A vertical extension of the inner region 21 of the chip 200 is "floating" within a cavity 45 that is formed between the chip 200 and the molded compound. That is, the bonded portion of the backside of the chip may be offset such that the inner region of the backside is not bonded to the lead frame, and is free hanging within the cavity 45. Alternatively, the chip 200 may be bonded to the lead frame.

The cavity 45 is formed between sidewalls of the molded compound 40 and at least partially between the backside of the chip 200 and the base portion of the molded compound 40. Specifically, the cavity 45 is formed between the inner region 21 of the chip 200 at the backside and the base portion of the molded compound 40. Thus, the cavity 45 surrounds the chip 200 with the exception of a portion of the chip 200 where the chip 200 is bonded to the lead frame 42 (i.e., at the peripheral region 22). The bond wire 43 and the die pad 44 are also provided within the cavity 45

The stress-decoupling material 23 is dispensed to fill the cavity 45, including the area between the backside of the chip 200 and the bottom portion of the molded compound 40, to fill the trenches 20, to encapsulate the bond wire 43 and the die pad 44, and to cover the frontside of the chip 200, including an area over the MEMS element 12. Thus, the chip 200 is bonded to the lead frame 42 by the attach layer 41, and the remaining outer periphery of the chip 200 is encapsulated in the stress-decoupling material 23. This asymmetric arrangement may further serve to decouple mechanical stress from the MEMS element 12.

Although embodiments described herein relate to MEMS pressure sensors, and, in some cases capacitive pressure sensors, it is to be understood that other implementations may include other types of pressure sensors or other types of MEMS devices or MEMS elements. In addition, although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid in the understanding of the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Thus, it is understood that modifications and variations of the arrangements and the details described herein will be apparent to others skilled in the art.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:

1. A semiconductor device, comprising:
   a semiconductor chip comprising:
      a substrate having a first surface and a second surface arranged opposite to the first surface;
      a microelectromechanical systems (MEMS) element, comprising a sensitive area, disposed at the first surface of the substrate in a first region of the semiconductor chip;
      a back end of line (BEOL) stack disposed on the first surface of the semiconductor chip that extends laterally from the MEMS element, in the first region, into a second region of the semiconductor chip, and
      a first cavity formed in the BEOL stack that exposes the sensitive area of the MEMS element, wherein the first cavity extends entirely through the BEOL stack over the first region thereby exposing the sensitive area of the MEMS element;
      at least one stress-decoupling trench laterally spaced from the MEMS element and laterally spaced from the first cavity with a portion of the BEOL stack interposed therebetween, wherein the at least one stress-decoupling trench extends through the BEOL stack and through the first surface into the substrate, wherein the at least one stress-decoupling trench extends partially into the substrate towards the second surface although not completely to the second surface, and wherein the at least one stress-decoupling trench defines a vertical boundary between the first region of the semiconductor chip and the second region of the semiconductor chip; and
      a stress-decoupling material that fills the at least one stress-decoupling trench, fills the first cavity, and covers the sensitive area of the MEMS element.

2. The semiconductor device of claim 1, wherein the stress-decoupling material is a silicone-based material.

3. The semiconductor device of claim 1, wherein the stress-decoupling material is disposed over the sensitive area of the MEMS element such that the sensitive area of at least one MEMS element is sealed from an external environment, wherein the stress-decoupling material is configured to permit a sensor functionality of the MEMS element.

4. The semiconductor device of claim 3, wherein the MEMS element is a capacitive pressure sensor.

5. The semiconductor device of claim 1, wherein the stress-decoupling material densely fills the at least one stress-decoupling trench such that voids are absent from inside the at least one stress-decoupling trench.

6. The semiconductor device of claim 1, wherein the stress-decoupling material loosely fills the at least one stress-decoupling trench such that voids are distributed substantially throughout the stress-decoupling material inside the at least one stress-decoupling trench.

7. The semiconductor device of claim 1, wherein the stress-decoupling material completely fills the at least one stress-decoupling trench and covers the sensitive area of the MEMS element as a unitary member.

8. The semiconductor device of claim 1, wherein the stress-decoupling material is a conformal layer that lines sidewalls and a bottom of the at least one stress-decoupling trench and covers a contour of an outer surface of the BEOL stack and the sensitive area of the MEMS element.

9. The semiconductor device of claim 8, wherein the conformal layer completely fills the at least one stress-decoupling trench.

10. The semiconductor device of claim 8, wherein the conformal layer partially fills the at least one stress-decoupling trench such that a void between the sidewalls of the at least one stress-decoupling trench is present.

11. The semiconductor device of claim 1, wherein the first region is an inner region of the semiconductor chip and the second region is a peripheral region of the semiconductor chip.

12. The semiconductor device of claim 1, further comprising:
   a package that includes a lead frame and a molded compound that encapsulates the semiconductor chip and the lead frame,
   wherein the molded compound includes sidewalls that form a second cavity over at least a portion of the semiconductor chip, including over the sensitive area of the MEMS element, and the stress-decoupling material at least partially fills the second cavity.

13. The semiconductor device of claim 12, wherein an entire portion of the second surface of the semiconductor chip is bonded to the lead frame such that the semiconductor chip is bonded at the first region and the second region.

14. The semiconductor device of claim 12, wherein a portion of the second surface of the semiconductor chip is asymmetrically bonded to the lead frame such that the second surface is bonded to the lead frame at the second region and not at the first region.

15. The semiconductor device of claim 14, further comprising:
   a third cavity formed between the second surface of the semiconductor chip at the first region and a base of the molded compound, and the stress-decoupling material completely fills the third cavity.

16. The semiconductor device of claim 15, wherein a continuous cavity, including the first cavity, the second cavity and the third cavity, surrounds the semiconductor chip, excluding a portion of the semiconductor chip at the second region bonded to the lead frame, and the stress-decoupling material at least partially fills the continuous cavity such that the stress-decoupling material encapsulates the semiconductor chip.

17. The semiconductor device of claim 12, wherein the second surface of the semiconductor chip is asymmetrically bonded to a base portion of the molded compound such that the second surface is bonded to the to base portion at the second region and not at the first region.

18. The semiconductor device of claim 17, further comprising:
   a third cavity formed between the second surface of the semiconductor chip at the first region and the base portion of the molded compound;

a continuous cavity, including the first cavity, the second cavity, and the third cavity, the continuous cavity being formed between the sidewalls of the molded compound and sidewalls of the semiconductor chip, and between the base portion of the molded compound and the second surface of the semiconductor chip underneath the first portion, and wherein the stress-decoupling material at least partially fills the continuous cavity such that the semiconductor chip is fully encapsulated by the stress-decoupling material with an exception of a bonding area at which the second surface is bonded to the molded compound at the second region.

19. The semiconductor device of claim 1, wherein the BEOL stack is in direct contact with the MEMS element.

* * * * *